US009825389B2

(12) United States Patent
Doye et al.

(10) Patent No.: US 9,825,389 B2
(45) Date of Patent: Nov. 21, 2017

(54) CONNECTOR PROVIDING SOLDERLESS CONTACT

(71) Applicant: 3M INNOVATIVE PROPERTIES COMPANY, St. Paul, MN (US)

(72) Inventors: Dennis L. Doye, Cedar Park, TX (US); Alexander W. Barr, Austin, TX (US); Douglas B. Gundel, Cedar Park, TX (US); Charles F. Staley, Austin, TX (US)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

(21) Appl. No.: 15/112,209

(22) PCT Filed: Jan. 22, 2015

(86) PCT No.: PCT/US2015/012341
§ 371 (c)(1),
(2) Date: Jul. 18, 2016

(87) PCT Pub. No.: WO2015/112659
PCT Pub. Date: Jul. 30, 2015

(65) Prior Publication Data

US 2016/0344124 A1 Nov. 24, 2016

Related U.S. Application Data

(60) Provisional application No. 61/931,332, filed on Jan. 24, 2014.

(51) Int. Cl.

| | |
|---|---|
| ***H01R 12/00*** | (2006.01) |
| ***H05K 1/00*** | (2006.01) |
| ***H01R 12/88*** | (2011.01) |
| ***H01R 12/62*** | (2011.01) |
| ***H01R 12/70*** | (2011.01) |
| ***H01R 13/50*** | (2006.01) |

(Continued)

(52) U.S. Cl.
CPC ............. *H01R 12/88* (2013.01); *H01R 12/62* (2013.01); *H01R 12/7082* (2013.01);
(Continued)

(58) Field of Classification Search
CPC ...... H01R 12/52; H01R 12/526; H01R 12/59; H01R 12/77; H01R 12/79
(Continued)

(56) References Cited

U.S. PATENT DOCUMENTS 4,169,641 A * 10/1979 Olsson ................... H01R 12/62 439/493
4,252,389 A * 2/1981 Olsson ................. H01R 13/193 439/259

(Continued)

FOREIGN PATENT DOCUMENTS

| | | |
|---|---|---|
| EP | 0 509 380 | 10/1992 |
| WO | 2012/080843 | 6/2012 |

OTHER PUBLICATIONS

PCT International Search Report from PCT/US2015/012341 dated Apr. 10, 2015, 3 pages.

*Primary Examiner* — Hae Moon Hyeon
(74) *Attorney, Agent, or Firm* — Robert S. Moshrefzadeh

(57) ABSTRACT

Connectors providing solderless contact between conductors and a plurality of contact pads disposed on a substrate are disclosed. Connectors accommodating cables including pairs of insulated conductors are disclosed. Connector assemblies including frames for reversibly mounting the connectors with substrates having a plurality of contact pads are also disclosed.

14 Claims, 6 Drawing Sheets

(51) Int. Cl.
*H01R 13/6461* (2011.01)
*H01R 13/6597* (2011.01)

(52) U.S. Cl.
CPC ......... *H01R 13/50* (2013.01); *H01R 13/6461* (2013.01); *H01R 13/6597* (2013.01)

(58) Field of Classification Search
USPC .............. 439/81, 67, 77, 492, 493, 495, 329
See application file for complete search history.

(56) References Cited

U.S. PATENT DOCUMENTS

| | | | | |
|---|---|---|---|---|
| 4,252,392 | A * | 2/1981 | Whiteman, Jr. | H01R 12/79 439/267 |
| 4,634,195 | A * | 1/1987 | Shoemaker | H01R 12/79 439/493 |
| 4,735,582 | A * | 4/1988 | Fusselman | H01R 12/62 439/329 |
| 5,049,090 | A * | 9/1991 | Johnson | H01R 12/62 439/329 |
| 5,181,854 | A * | 1/1993 | Masuda | H01R 12/7082 439/493 |
| 7,833,025 | B2 | 11/2010 | Voli et al. | |
| 7,927,110 | B1 * | 4/2011 | Zhu | H01R 12/79 439/493 |
| 8,821,179 | B2 * | 9/2014 | Yang | H01R 12/62 439/345 |
| 2006/0292900 | A1 | 12/2006 | Pabst et al. | |
| 2008/0207035 | A1 * | 8/2008 | Jahn | H01R 12/585 439/329 |

* cited by examiner

CONNECTOR PROVIDING SOLDERLESS CONTACT

BACKGROUND

Connector devices are useful in attaching cables to mounting structures of connection surfaces or ports. Connectors providing solderless contact may allow for connections to be quickly and reversibly made between exposed conductors and connection pads.

SUMMARY

In some embodiments, the present disclosure relates to a connector for providing solderless contact between a plurality of conductors and a corresponding plurality of contact pads disposed on a substrate. The connector includes an elongated beam extending along a first direction, a plurality of spaced apart resilient first fingers—each first finger extending from the beam and terminating at a finger tip—and a base including a plurality of channels extending along a second direction, each channel being configured to receive n conductors, n being an integer and at least one, the channel corresponding to n resilient first fingers facing a front end of the channel, the finger tips of the n resilient first fingers being lower than the front end of the channel, such that when the channel receives n conductors with a front portion of each conductor extending beyond the front end of the channel and bent so that a front end of the conductor is disposed under a corresponding finger tip, and the connector is positioned on a substrate with the corresponding finger tip disposed on a corresponding contact pad, the corresponding finger tip securely holds the front end of the conductor in contact with the contact pad.

In another embodiment, the present disclosure relates to a connector for providing solderless contact between a plurality of conductors and a corresponding plurality of contact pads disposed on a substrate including a body and a plurality of spaced apart fingers, each finger extending from the body and terminating at a resilient finger tip, such that when a front portion of each conductor in a plurality of conductors is disposed on a corresponding contact pad in a plurality of contact pads disposed on a substrate, the resilient finger tips securely hold the front portions in contact with the contact pads.

DETAILED DESCRIPTION

Figure 1:
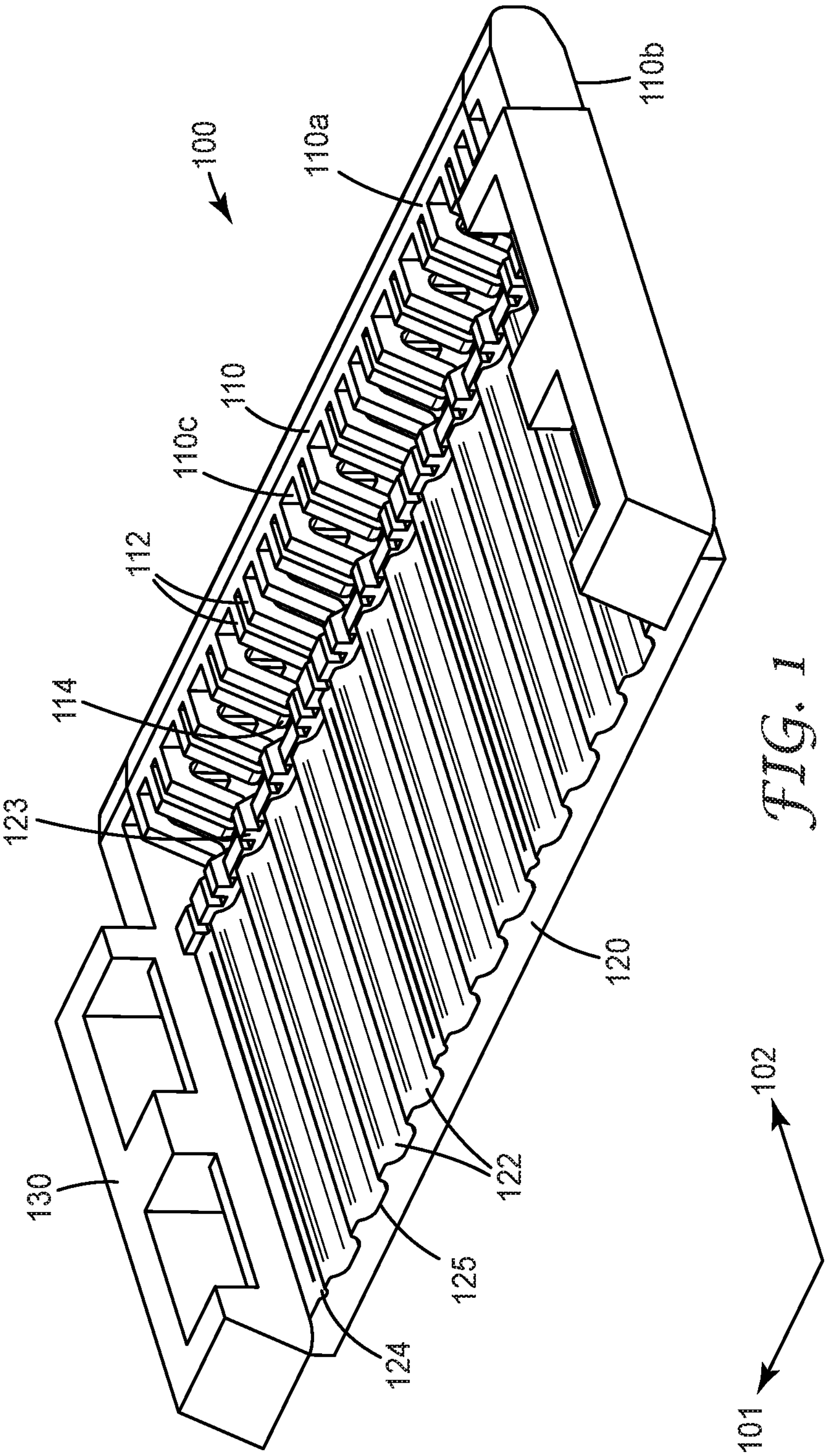
FIG. 1 is a top perspective view of a connector.

FIG. 1 is a top perspective view of a connector. Connector 100 includes elongated beam 110 including fingers 112 having fingertips 114, base 120 including primary channels 122 and secondary channels 124, and sides 130. The precise shape and size of connector 100 is intended to be exemplary.

Connector 100 includes an elongated beam. Elongated beam 110, in the illustration of FIG. 1, runs in a generally transverse direction 101 and connects each of sides 130. The particular design of elongated beam 110 depends on the desired characteristics and application of connector 100. For example, elongated beam 110 may be thick or reinforced to provide rigidity, durability, or warping resistance in applications where the beam may be subjected to force or environmental stresses. Likewise, elongated beam 110, in applications where flexibility or being lightweight is desirable, the beam may have a slim or reduced profile to be more easily deformable and to reduce the overall weight of connector 100. In some embodiments, elongated beam 110 may, as depicted in FIG. 1, have a curved or partially curved cross section. In some cases, the cross section may enable it to conform or mate with a mounting surface or mounting structure. In some embodiments, elongated beam 110 may have any appropriate cross sectional profile, and such minor design modifications are within the abilities of the skilled person. Elongated beam 110 may have a generally elongated shape; that is, the beam may have a maximum length along a longitudinal direction of the beam and a maximum width along a transverse direction substantially perpendicular to the longitudinal direction. In some embodiments, a ratio of the maximum length to the maximum width may be at least 5, at least 10, at least 20, or even at least 30.

Protruding or extending from elongated beam 110 are spaced apart fingers 112, each having fingertips 114. Fingers 112 may be any suitable size and any suitable shape. For example, fingers 112 may include a first leg and a second leg, where the first leg extends from elongated beam 110 toward along the same direction as primary channels 122 and secondary channels 124, and the second leg makes an oblique angle with the first leg and terminates at fingertip 114. The oblique angle may be acute or obtuse. Fingers 112 may also extend or protrude from any part of elongated beam 110. For example, elongated beam 110 may have a top surface 110*a*, a bottom surface 110*b*, and a side surface 110*c* connecting the top and bottom surface, and one or more of fingers 112 may extend from the side surface or the bottom surface. In some embodiments, fingers 112 are formed from the same material as elongated beam 110. In some embodiments, elongated beam 110 and fingers 112 form part of the same unitary body. Fingers 112 may be formed from a suitable material to be considered resilient; that is, to recover from deformation as the force is removed. Such resilient fingers may be bent or flexed without permanent deformation. The suitable degree resilience may depend on the application, including the design and configuration of both the mounting frame and the mechanism through which connector 100 is mated. Fingers 112 may be formed from at least one of a rubber, a plastic, or an elastomer. In some embodiments, fingers 112 may have an electrically conductive interior while having an electrically insulative exterior; for example, fingers 112 may be metal and may be surrounded by a dielectric. Fingers 112 may include one or more linear segments, one or more curved segments, or some combination of the two. Fingers 112 may be arranged in spaced apart pairs on elongated beam 110, or they may be spaced apart and not paired with another finger. In many embodiments fingers 112 will include both single fingers and pairs of fingers. Pairs of fingers may be spaced apart by a certain first distance (between the fingers of the pair) while the pairs of fingers may be separated by a larger second distance. In other words, the distance between a finger and an immediately adjacent finger may be either a first distance or a second distance greater than the first distance. In some embodiments, the fingers extending from elongated beam 110 may not extend above a maximum height of the beam. In some embodiments, fingers 112 may have a different shape for top surfaces and bottom surfaces. Fingers 112, further, need not all be the same shape. In some embodiments, each fingertip of each pair of fingers may be electrically insulative, while the fingertip of each single finger may be electrically inductive. Fingertips 114 may be rounded, pointed, multi-tipped, flat, or may have any other suitable shape. In some embodiments, fingertips 114 may be electrically insulative. In some embodiments, fingertips 114 may be electrically conductive. Some fingertips may be electrically insulative while others are electrically conductive.

Base 120 includes primary channels 122 and secondary channels 124, which may be collectively referred to as channels extending along direction 102. Base 120 may be a substantially planar surface. In some embodiments base 120 has substantially the same width as the length (i.e. the longitudinal direction) of elongated beam 110. Base 120 may be primarily used to support a cable configured to fit within connector 100. Base 120 may have any suitable length and thickness. In some embodiments, the thickness of base 120 may vary along at least one of its length or width. In some embodiments, base 120, elongated beam 110, and fingers 112 may form a unitary construction.

Base 120 includes channels. Primary channels 122, in the configuration shown in FIG. 1, are adapted to receive insulated conductor pairs. Secondary channels 124, are adapted to receive uninsulated conductors, such as drain wires or grounding wires. Primary channels 122 and secondary channels 124 may have the same shape; for example, each channel may have an arcuate cross section in a cross section normal to a longitudinal direction of the channels. In some embodiments, primary channels 122 and secondary channels 124 may have different shapes. Primary channels 122 and secondary channels 124 may or may not have the same depth or width. Primary channels 122 may be configured to receive a certain number, n, of insulated conductors (n being an integer value of at least 1), and each of primary channels 122 may correspond to and face n fingers 112. In some embodiments, secondary channels 124 may be configured to receive p uninsulated conductors (where p is an integer and at least one), where each of second channels 124 corresponds to and faces p fingers 112. In some embodiments, base 120 may have ridges between at least some adjacent channels, whether they are primary or secondary channels. Each channel has a front end 123 (in FIG. 1, oriented toward fingers 112 and elongated beam 110) and a rear end 125. In some embodiments, the rear end is higher than the front end. In other embodiments, the front and rear end are the same height. Each channel of connector 100 may be configured to receive one or two conductors.

Side 130 may be attached to elongated beam 110 or base 120. In some embodiments, side 130 is attached to both elongated beam 110 and base 120 and forms a unitary construction. Connector 100 may include side 130 on one, two, three, or more sides, depending on the geometry of base 120 and the desired overall shape of connector 100. Side 130 may be made from the same material as or a different material from other parts of connector 100.

Overall, connector 100 may be formed through any suitable process, including injection molding, metal or powder injection molding, or the like. Any suitable material, including plastics, metals, polymers, or other organic or inorganic material may be used, and the materials may be selected to be lightweight, physically durable, flexible or pliable, warp- or melt-resistant, or otherwise optimized for the ambient conditions of the desired use. For some applications, it may be desirable for connector 100 to be electrically non-conducting for safety reasons, or to prevent static discharge. In some embodiments, parts of connector 100 such as elongated beam 110 and sides 130 may be disconnectable or easily reattachable.

Figure 2A:
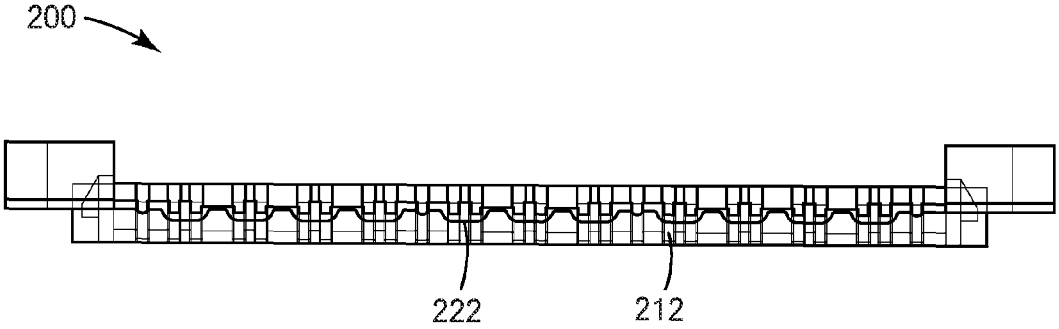
FIG. 2A is a rear elevation view of the connector of FIG. 1.
Figure 2B:
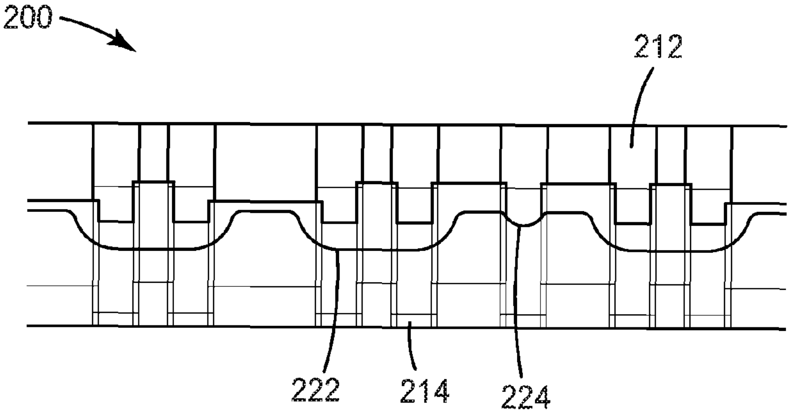
FIG. 2B is a close-up of a section of FIG. 2A enlarged to show detail.

FIG. 2A is a rear elevation view of the connector of FIG. 1. Connector 200 includes primary channels 222 and fingers 212. FIG. 2B is a close-up of a section of FIG. 2A enlarged to show detail. Connector 200 includes fingertips 214, primary channels 222, and secondary channels 224. The base of connector 200 is shown as translucent to show the relative configuration of certain features. FIGS. 2A and 2B illustrate a spatial relationship between fingers 212 including fingertips 214, primary channels 222, and secondary channels 224. Fingertips 214 extend beyond (below, from the rear elevation perspective of FIGS. 2A and 2B) the front of both primary channels 222 and secondary channels 224 of connector 200. In some embodiments, fingertips 214 need only extend beyond the channels to which they correspond; for example, fingertips 214 associated with primary channels 222 may extend beyond both primary channels 222 and secondary channels 224, while fingertips 214 associated with secondary channels 224 may extend beyond secondary channels 224 but not primary channels 222.

Figure 3:
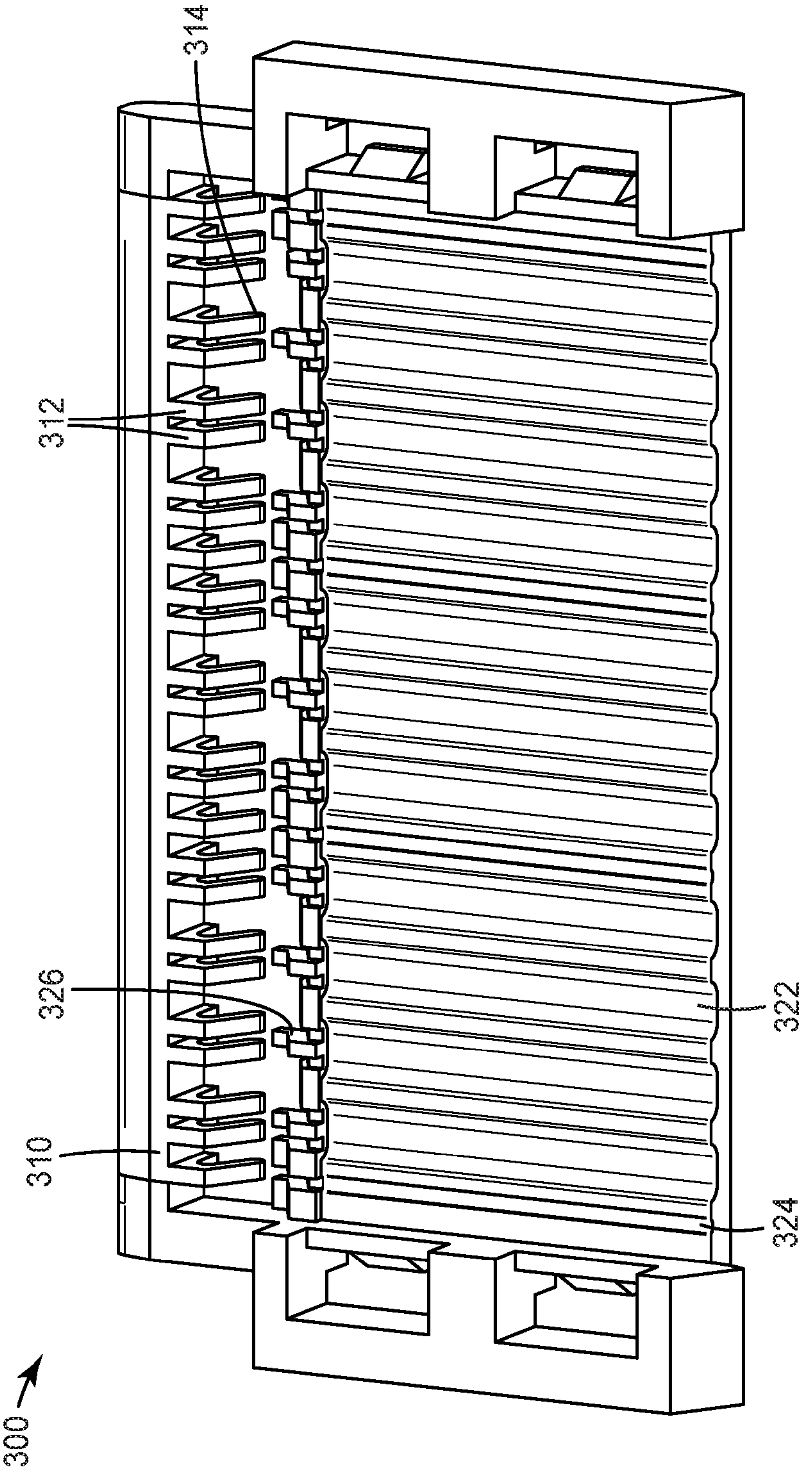
FIG. 3 is a top perspective view of the connector of FIG. 1.

FIG. 3 is a top perspective view of the connector of FIG. 1. Connector 300 includes elongated beam 310 including fingers 312 having fingertips 314, primary channels 322, secondary channels 324, and secondary fingers 326. While FIG. 3 depicts elongated beam 310, fingers 312 with fingertips 314, primary channels 322 and secondary channels 324, which are described elsewhere, FIG. 3 also depicts secondary fingers 326 extending from the base of connector 300 toward fingers 312 and elongated beam 310. Secondary fingers 326 may correspond to each primary channel. In some embodiments, there are (m−1) secondary fingers, where m is an integer and at least two, and m equals the number of insulated conductors per primary channel. For example, in embodiments where each primary channel is configured to receive two insulated conductors, there may be a single secondary finger associated with each channel. In some embodiments, secondary fingers 326 may be disposed between each insulated conductor: more particularly, between the front portion of two neighboring conductors. In some embodiments, secondary fingers 326 may be, from a top plan view, centered within some or all of the width of primary channels 322 or centered within some or all of the width of ridges between channels. In some embodiments, secondary fingers 326 may be disposed between primary channels 322 and secondary channels 324. In some embodiments, as shown in FIG. 3, there may be more than one type of secondary fingers 326, and these types may have different shapes, lengths, and widths. Secondary fingers 326 may be of similar shape, size, and formed from a similar material as for fingers 312.

Figure 4:
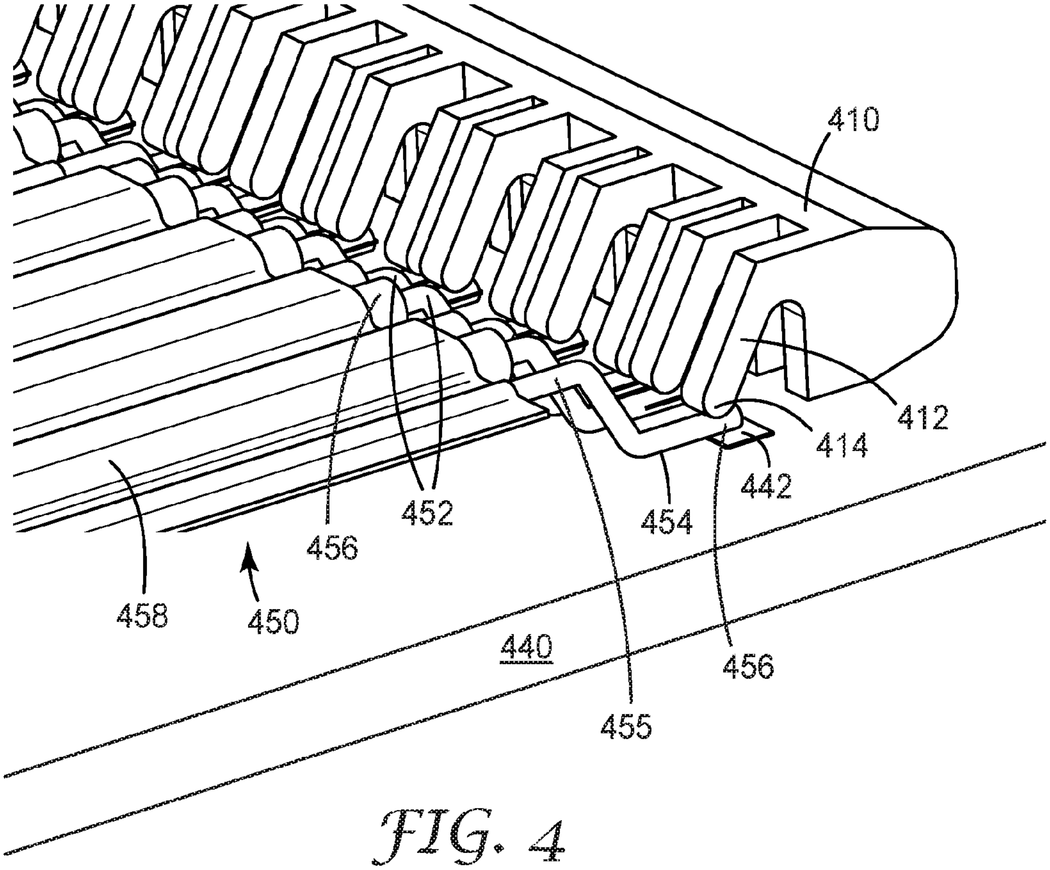
FIG. 4 is a top perspective sectional view of a connector assembly.

FIG. 4 is a top perspective sectional view of a connector assembly. FIG. 4 shows an assembly including elongated beam 410 having fingers 412 with fingertips 414, substrate 440 including contact pads 442, and cable 450 including conductors 452 and drain wire 454, insulation 456, and jacket 458. FIG. 4 is a sectional view, with the sides and base of the connector removed for ease of illustration. FIG. 4 depicts certain functions of connectors described herein; for example, that when the channels of the base of the connector receives a number of conductors, with a front portion 455 of each conductor extending beyond the front end of the channel and is bent so that a front end 456 of the conductor is disposed under a corresponding fingertip 414, and the connector is positioned on a substrate 440 with the corresponding fingertip disposed on a corresponding contact pad 442, the corresponding finger tip securely holds the front end of the conductor in contract with the contact pad. Each pair of fingers 412 may hold each of the front ends of a pair of conductors 452 securely in contact with contact pads 442, where the pair of conductors is a differential pair.

Substrate 440 may be any suitable mounting surface, including any combination or combination of materials. Substrate 440 is at least in part electrically non-conductive. Substrate may be any suitable shape and size, not necessarily thin and substantially planar as depicted in FIG. 4. Contact pads 442 are disposed on substrate 440 and may be small, discrete portions of conductive material. In some embodiments, contact pads 442 may be copper or gold. Contact pads 442, may be any suitable size or shape, and in some embodiments may be different sizes or shapes. In some embodiments, contact pads 442 may be substantially flat or planar; in some embodiments, contact pads 442 may be slightly curved to accommodate the shape of an attached conductor. Contact pads 442 may extend along a direction parallel to the longitudinal direction of elongated beam 410. Contact pads 442, in other embodiments, may extend at an oblique angle in relation to the longitudinal direction of the elongated beam. Contact pads 442 may be connected to other electrical components, voltage rails, ground wires, or the like by conductive paths, including vias. In some embodiments, contact pads 442 may correspond to fingers 412 in, for example, a one-to-one relationship. In some embodiments there may be more than one of fingers 412 corresponding to each contact pads 442 or more than one contact pad 442 for each of fingers 412.

Cable 450 includes conductors 452 and drain wire 454, insulation 456, and jacket 458. In some embodiments, cable 450 may be a flat or substantially flat ribbon cable. Conductors 452 can include or be formed from any suitable electrically conductive material, and may be selected for its electrical or physical properties, for example, conductivity, coefficient of thermal expansion, malleability, or ductility. Suitable materials include copper, aluminum, and silver. Drain wire 454 may have similar characteristics or be formed from a similar material as conductors 452, or it may have different dimensions or composition. Insulation 456 can include any suitable dielectric material for insulating conductor 452 and may be selected for flexibility, melting point, dielectric constant, or any other physical or electrical property or properties. Suitable materials include polyethylene, polyethylene foam, or polytetrafluoroethylene. The materials for both conductors 452 and insulation 456 may be selected to give an overall nominal characteristic impedance within a desired range. Drain wire 454 may be uninsulated. In some embodiments, the front portions or ends of conductors 452 or drain wire 454 may be coined or plated (for example, with gold) to improve contact or conductivity. Conductors and drain wire may be any suitable wire gauge.

Jacket 458 may be any suitable material to impart desirable external properties on cable 450, such as abrasion or fire-resistance. In some embodiments, a flexible material may be selected to preserve desired physical properties of cable 450. Jacket 458 may also be thick to prevent damage or wear to the internal conductors 452 associated with use. In some embodiments, jacket 458 may also include one or more conductive layers along the interior perimeter of jacket 458, such as a braided copper layer or silver plating. Conductive layers may help prevent electromagnetic fields within the cable from radiating into the external environment or from interfering with nearby electronic components. In some embodiments, jacket 458 may be formed from a polymeric material.

In the overall connected configuration of FIG. 4, cable 450 is securely held in place. Fingers 412, and more specifically, fingertips 414, securely holds the exposed front end of either conductors 452 or drain wire 454 in place against contact pads 442. Conductors 452, and in some cases drain wire 454 may have generally have a Z shape between fingers 412 and the end of the channel.

Figure 5:
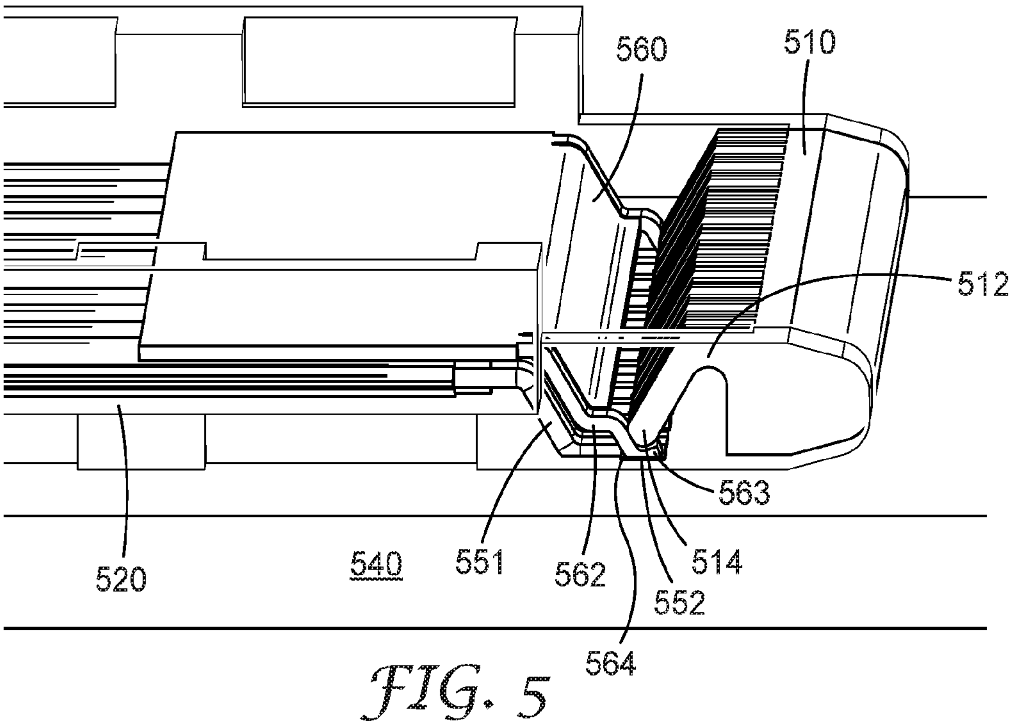
FIG. 5 is a top-side perspective view of a connector assembly.

FIG. 5 is a top-side perspective view of a connector assembly. FIG. 5 shows an assembly including elongated beam 510 having fingers 512 with fingertips 514, base 520, substrate 540, and shield 560 including shield fingers 562. The sides of the connector are illustrated as translucent to better explain otherwise obscured detail of the connector assembly. Shield 560 may be any suitable conductive material, such as copper. Shield 560 may prevent interference with signals through the cable. In some embodiments, shield 560 is in contact with one or more of the uninsulated drain wires. Shield 560 may have shield fingers 562, extending from one or more portions of shield 560 and spaced apart from the rest of shield 560 for at least some of the length of shield 560. In some embodiments, shield fingers 562 may extend from shield 560 at locations corresponding to drain wires 551. In some embodiments, shield fingers 562 may be in contact at least at one point 552 with drain wires. As depicted in FIG. 5, one or more of fingertips 514 may securely hold one of shield fingers 562 in place. Shield fingers 562, like fingers 512, have shield fingertips 563, which may be held in place against a drain wire 551 and a contact pad 564. In some embodiments, shield fingers 562 may have a generally linear staircase shape.

Figure 6:
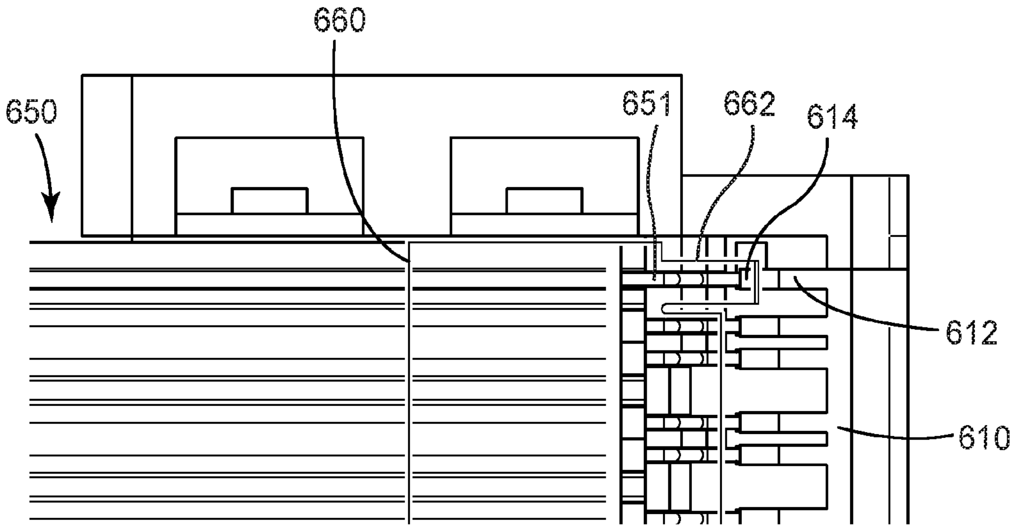
FIG. 6 is a top plan view of the configuration of FIG. 5.

FIG. 6 is a top plan view of the configuration of FIG. 5. FIG. 6 shows an assembly including elongated beam 610 having fingers 612 with fingertips 614, cable 650, and shield 660 including shield fingers 662. In this depiction, shield 660 is illustrated as translucent to show the spatial relationship between the shield, conductors, and fingers. Shield fingers 662 correspond, in this top plan view, to locations of the uninsulated drain wires 651 of cable 650.

Figure 7:
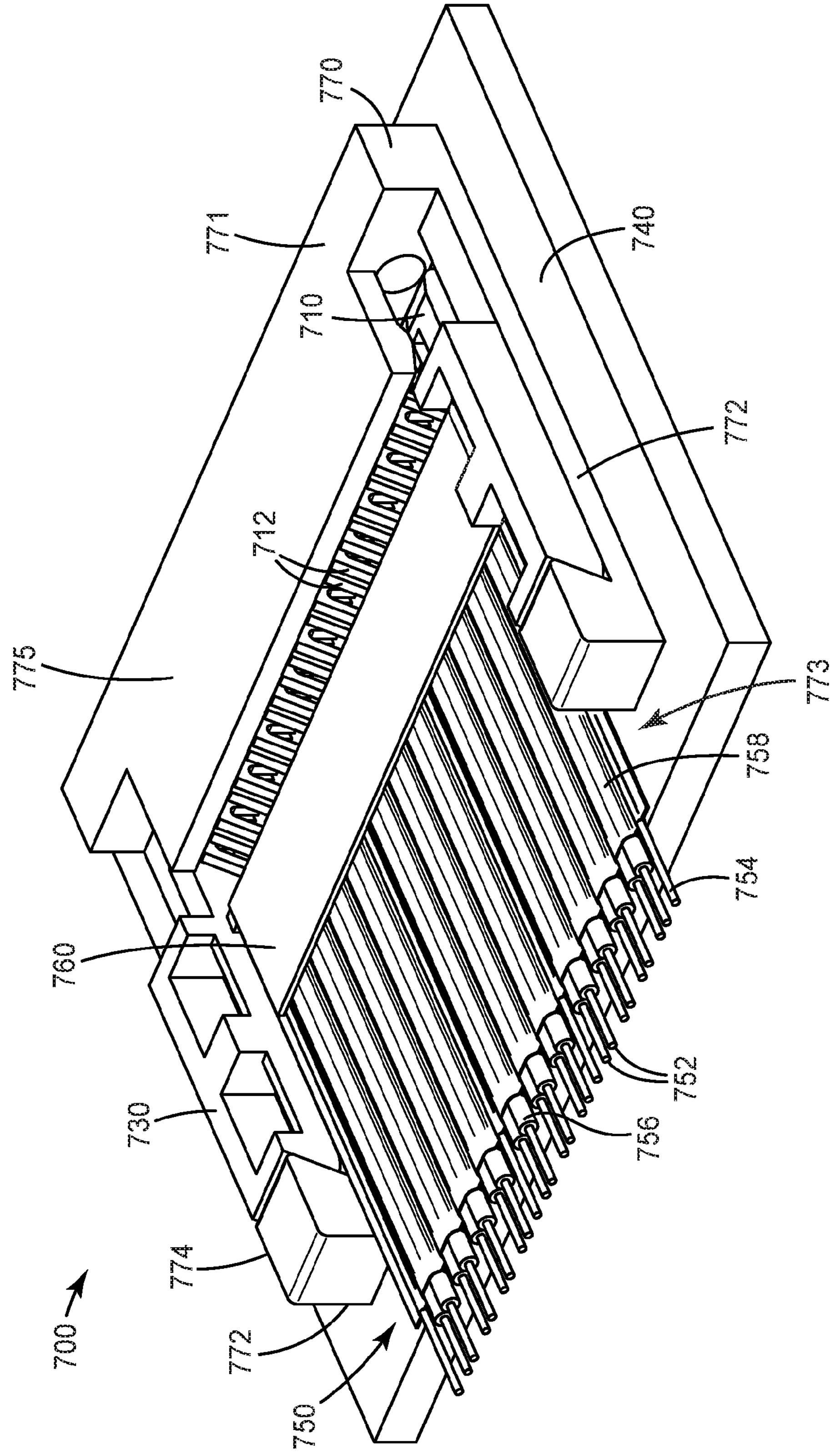
FIG. 7 is a top-rear perspective view of a connector assembly.

FIG. 7 is a top-rear perspective view of a connector assembly. Assembly 700 includes elongated beam 710 having fingers 712, sides 730, substrate 740, cable 750 including conductors 752 and drain wire 754, insulation 756, and jacket 758, and mounting frame 770. FIG. 7 depicts the overall configuration of a connector assembly. For example, connector assembly 700 includes elongated beam 710 having fingers 712 and sides 730, generally corresponding to connector 100 in FIG. 1. Cable 750 including conductors 752, drain dire 754, insulation 756, and jacket 758 and is disposed on the base of the connector (corresponding, for example, to base 120 in FIG. 1), which is obscured by the cable. The longitudinal direction of the channels of the base of the connector may be parallel or may make an oblique angle with substrate 740. The longitudinal direction of elongated beam 710 may also be parallel to substrate 740.

Frame 770 is attached to substrate 740 and provides a mounting mechanism for the connector to attach. Frame 770 may have a front wall 771 and opposing substantially parallel side walls 772, as depicted in FIG. 7. In some embodiments, frame 770 may include a top wall 775, although the top wall should in most cases not extend as far as side walls of frame 770 to facilitate insertion of the connector. The top wall (if included) and side walls may define a top opening next to the top wall at the rear of the frame. The front wall and the side walls may define, at least partially, an open rear 773 of the frame, such that when the frame is secured to substrate 740 having contact pads located between the opposing side walls, the connector makes contact with substrate 740 by being inserted into frame 770 from the open rear of the frame, the side walls guiding the connector towards the front wall. In some embodiments the connector may be inserted into frame 770 along a direction making an oblique angle with substrate 740 in order to prevent the connector from running into the back stop 774 of frame 770, which protrudes from at least one side wall of frame 770, followed by insertion of the connector along another direction parallel to substrate 740 after the connector moves past the back stop of frame 770. The forward-slanted walls of the back stop of frame 770 secure the connector's attachment by interfacing with sides 730 of the connector. Springs, levers, or other mechanisms may apply pressure from the front of frame 770 in order to push the connector against the back stop. In some embodiments, the walls of the back stop of frame 770 may be any other suitable shape, and may rely on geometry, pressure, or a combination of the two to maintain a mating connection between the connector and substrate 740 via frame 770. In embodiments where springs are used, the connector may be manually manipulated or rocked into place, compressing the springs. When the connector is pushed past the back stop of frame 770, the connector may be released and allowed to be pressed backwards against the back stop. When the connector is securely mated with substrate 740 via frame 770, fingers 712 securely hold the front portions of conductors 752 and drain wire 754 in place in contact with the contact pads.

Directly and solderlessly connecting a connector to a board such as substrate 740 in FIG. 7 may have several advantages over the use of standard connectors, such as SAS, mini-SAS, or SATA. Because the conductors are in contact with the board directly, the reduced material that the signal travels through between the termination of the cable conductor and the board conductors may significantly improve both near and far end cross talk over conventional connectors. Further, the exposed ends of the conductors enables the shield design to be advantageously near to the exposed, or uninsulated portions of the conductors, also reducing crosstalk compared to conventional connectors. In some embodiments, crosstalk may be less than −30 dB, or even less than −40 dB. Similarly, in embodiments where the electrical impedance between the end of the conductors and the board conductors (for example, 85 ohms) are well matched, the direct or short connection between the conductors and the board conductors enable minimal impedance discontinuity which may minimize signal reflections, making such connectors appropriate even for very fast signal rates, such as 25 Gbps or more.

The following are a list of items of the present disclosure:

Item 1 is a connector for providing solderless contact between a plurality of conductors and a corresponding plurality of contact pads disposed on a substrate, the connector comprising:

an elongated beam extending along a first direction;

a plurality of spaced apart resilient first fingers, each first finger extending from the beam and terminating at a finger tip; and a base comprising a plurality of channels extending along a second direction, each channel being configured to receive n conductors, n being an integer and at least one, the channel corresponding to n resilient first fingers facing a front end of the channel, the finger tips of the n resilient first fingers being lower than the front end of the channel, such that when the channel receives n conductors with a front portion of each conductor extending beyond the front end of the channel and bent so that a front end of the conductor is disposed under a corresponding finger tip, and the connector is positioned on a substrate with the corresponding finger tip disposed on a corresponding contact pad, the corresponding finger tip securely holds the front end of the conductor in contact with the contact pad.

Item 2 is the connector of item 1, wherein the elongated beam, the plurality of spaced apart resilient first fingers, and the base form a unitary construction.

Item 3 is the connector of item 1 being a unitary construction.

Item 4 is the connector of item 1, wherein the first direction is perpendicular to the second direction.

Item 5 is the connector of item 1 having a transverse direction and a longitudinal direction, the first direction being parallel to the transverse direction, the second direction being parallel to the longitudinal direction.

Item 6 is the connector of item 1 having a transverse direction and a longitudinal direction, the first direction being parallel to the transverse direction, the second direction making an oblique angle with the longitudinal direction.

Item 7 is the connector of item 1, wherein each channel has a rear end opposite the front end of the channel, the rear end being higher than the front end.

Item 8 is the connector of item 1 for providing solderless contact between a plurality of conductors and a corresponding plurality of contact pads disposed on a top surface of a substrate, wherein the first direction is parallel to the top surface.

Item 9 is the connector of item 1 for providing solderless contact between a plurality of conductors and a corresponding plurality of contact pads disposed on a top surface of a substrate, wherein the second direction is parallel to the top surface.

Item 10 is the connector of item 1 for providing solderless contact between a plurality of conductors and a corresponding plurality of contact pads disposed on a top surface of a substrate, wherein the second direction makes an oblique angle with the top surface.

Item 11 is the connector of item 1, wherein each channel has a rear end opposite the front end of the channel, such that when the tip securely holds the front end of the conductor in contact with the contact pad, the front end of the channel is closer to the substrate and the rear end of the channel is farther from the substrate.

Item 12 is the connector of item 1, wherein the elongated beam has a maximum length along the longitudinal direction of the elongated beam and a maximum width in a transverse direction perpendicular to the longitudinal direction, a ratio of the maximum length to the maximum width being at least 5, or at least 10, or at least 20, or at least 30.

Item 13 is the connector of item 1, wherein the elongated beam has a top surface, a bottom surface, and a side surface connecting the top surface to the bottom surface, at least one first finger extending from the side surface of the elongated beam.

Item 14 is a the connector of item 1, wherein the elongated beam has a top surface, a bottom surface, and a side surface connecting the top surface to the bottom surface, each first finger extending from the side surface of the elongated beam.

Item 15 is the connector of item 1, wherein the elongated beam has a top surface, a bottom surface, and a side surface connecting the top surface to the bottom surface, at least one first finger extending from the bottom surface of the elongated beam.

Item 16 is the connector of item 1, wherein the elongated beam has a top surface, a bottom surface, and a side surface connecting the top surface to the bottom surface, each first finger extending from the bottom surface of the elongated beam.

Item 17 is the connector of item 1, wherein each first finger comprises a first leg extending from the elongated beam along the second direction toward the plurality of channels, and a second leg extending from an end point of the first leg and terminating at the finger tip, the first leg making an oblique angle with the second leg.

Item 18 is the connector of item 17, wherein the oblique angle is an acute angle.

Item 19 is the connector of item 17, wherein the oblique angle is an obtuse angle.

Item 20 is the connector of item 1, wherein each finger tip comprises an electrically conductive interior and an electrically insulative exterior.

Item 21 is the connector of item 1, wherein each finger tip comprises a metal and a dielectric covering the metal.

Item 22 is the connector of item 1, wherein each finger tip is electrically insulative.

Item 23 is the connector of item 1, wherein the finger tip of at least one first finger is electrically conductive and the finger tip of at least one other first finger is electrically insulative.

Item 24 is the connector of item 1, wherein each finger comprises a resilient material.

Item 25 is the connector of item 1, wherein each finger comprises at least one of a rubber, a plastic and an elastomer.

Item 26 is the connector of item 1, wherein the plurality of spaced apart resilient first fingers comprises at least one pair of first fingers, the first fingers of the at least one pair of first fingers being separated from each other by a first distance, the at least one pair of first fingers being separated from an immediately adjacent first finger by a second distance greater than the first distance.

Item 27 is the connector of item 1, wherein the plurality of spaced apart resilient first fingers forms a plurality of spaced apart single first fingers and pairs of first fingers.

Item 28 is the connector of item 27, wherein the finger tip of each single first finger is adapted to securely hold a front end of a drain wire in contact with a contact pad, and the finger tips of each pair of first fingers are adapted to securely hold front ends of conductors of a differential pair in contact with contact pads.

Item 29 is the connector of item 27, wherein the finger tip of each single first finger is electrically conductive, and the finger tips of each pair of first fingers are electrically insulative.

Item 30 is the connector of item 1, wherein each channel has an arcuate cross-section in a direction normal to the second direction.

Item 31 is the connector of item 1, wherein each two neighboring channels in the plurality of channels are separated by a ridge.

Item 32 is the connector of item 1, wherein the plurality of channels comprises:

a plurality of first channels, each first channel being configured to receive m insulated conductors, m being an integer and at least two, the first channel corresponding to m resilient first fingers facing a front end of the first channel, the finger tips of the m resilient first fingers being lower than the first channel; and a plurality of second channels, each second channel being configured to receive p uninsulated conductors, p being an integer and at least one, the second channel corresponding to p resilient first fingers facing a front end of the second channel, the finger tips of the p resilient first fingers being lower than the second channel.

Item 33 is the connector of item 32 further comprising (m−1) spaced apart second fingers extending from the front end of each first channel toward the elongated beam, such that when the first channel receives m conductors with a front portion of each conductor extending beyond the front end of the channel, each second finger is disposed between the front portions of two neighboring conductors.

Item 34 is the connector of item 1, wherein each channel is configured to receive 1 or 2 conductors.

Item 35 is the connector of item 1, wherein when the finger tip securely holds the front end of the conductor in contact with the contact pad, the conductor generally has a Z shape between the front end of the channel and the contact pad.

Item 36 is the connector of item 1 further comprising an electrically conductive shield comprising a shield finger associated with a channel, the shield finger extending from a front end of the shield toward the finger tip of a first finger corresponding to the channel and terminating at a shield tip disposed under the finger tip, such that when the channel receives a conductor with a front portion of the conductor extending beyond the front end of the channel and bent so that a front end of the conductor is disposed under the finger tip, and the connector is positioned on a substrate with the finger tip disposed on a corresponding contact pad, the finger tip securely holds the front end of the conductor in contact with the contact pad and the shield tip.

Item 37 is the connector of item 1, wherein the shield finger has a linear staircase shape.

Item 38 is a connector assembly comprising:

the connector of item 1 for providing solderless contact between a plurality of conductors and a corresponding plurality of contact pads disposed on a substrate; and a frame for guiding a placement of the connector on the substrate, the frame comprising a front wall and opposing substantially parallel side walls extending from opposing ends of the front wall, the front wall and the side walls defining, at least partially, an open rear of the frame, such that when the frame is secured to the substrate with the contact pads located between the opposing side walls, the connector makes contact with the substrate by being inserted into the frame from the open rear of the frame, the side walls guiding the connector towards the front wall.

Item 39 is the connector assembly of item 38, wherein the frame further comprises a top wall extending along, but not as far as, the side walls.

Item 40 is the connector assembly of item 39, wherein the top wall and the side walls define a top opening next to the top wall at the rear of the frame.

Item 41 is the connector assembly of item 38, wherein the connector is initially inserted into the frame along a first direction making an oblique angle with the substrate in order to prevent the connector from running into a back stop protruding from a top of at least one of the side walls, followed by further insertion of the connector along a second direction parallel to the substrate after the connector moves past the back stop.

Item 42 is the connector assembly of item 38, wherein the frame further comprises a spring at the front wall, such that when the connector is inserted into the frame and makes contact with the substrate, the spring pushes the connector against the back stop.

Item 43 is a connector for providing solderless contact between a plurality of conductors and a corresponding plurality of contact pads disposed on a substrate, the connector comprising:

a body;

a plurality of spaced apart fingers, each finger extending from the body and terminating at a resilient finger tip, such that when a front portion of each conductor in a plurality of conductors is disposed on a corresponding contact pad in a plurality of contact pads disposed on a substrate, the resilient finger tips securely hold the front portions in contact with the contact pads.

Item 44 is the connector of item 43, wherein the body and the plurality of spaced apart fingers form a unitary construction.

Item 45 is the connector of item 43, being a unitary construction.

Item 46 is the connector of item 43, wherein each finger comprises a first leg extending from the body and a second leg extending from an end point of the first leg and terminating at the finger tip, the first leg making an oblique angle with the second leg.

Item 47 is the connector of item 46, wherein the oblique angle is an acute angle.

Item 48 is the connector of item 46, wherein the oblique angle is an obtuse angle.

Item 49 is the connector of item 43, wherein each finger tip comprises an electrically conductive interior and an electrically insulative exterior.

Item 50 is the connector of item 43, wherein each finger tip comprises a metal and a dielectric covering the metal.

Item 51 is the connector of item 43, wherein each finger tip is electrically insulative.

Item 52 is the connector of item 43, wherein the finger tip of at least one finger is electrically conductive and the finger tip of at least one other finger is electrically insulative.

Item 53 is the connector of item 43, wherein the plurality of spaced apart fingers comprises at least one pair of fingers, the fingers of the at least one pair of fingers being separated from each other by a first distance, the at least one pair of fingers being separated from an immediately adjacent finger by a second distance greater than the first distance.

Item 54 is the connector of item 43, wherein the plurality of spaced apart fingers forms a plurality of spaced apart single fingers and pairs of fingers.

Item 55 is the connector of item 54, wherein the finger tip of each single finger is adapted to securely hold a front end of a drain wire in contact with a contact pad, and the finger tips of each pair of fingers are adapted to securely hold front ends of conductors of a differential pair in contact with contact pads.

Item 56 is the connector of item 43, wherein when the finger tip securely holds the front end of the conductor in contact with the contact pad, the conductor generally has a Z shape between the front end of the channel and the contact pad.

Item 57 is a connector assembly comprising:

the connector of item 43 for providing solderless contact between a plurality of conductors and a corresponding plurality of contact pads disposed on a substrate; and a frame for guiding a placement of the connector on the substrate, the frame comprising a front wall and opposing substantially parallel side walls extending from opposing ends of the front wall, the front wall and the side walls defining, at least partially, an open rear of the frame, such that when the frame is secured to the substrate with the contact pads located between the opposing side walls, the connector makes contact with the substrate by being inserted into the frame from the open rear of the frame, the side walls guiding the connector towards the front wall.

Item 58 is the connector assembly of item 57, wherein the frame further comprises a top wall extending along, but not as far as, the side walls.

Item 59 is the connector assembly of item 58, wherein the top wall and the side walls define a top opening next to the top wall at the rear of the frame.

Item 60 is the connector assembly of item 57, wherein the connector is initially inserted into the frame along a first direction making an oblique angle with the substrate in order to prevent the connector from running into a back stop protruding from a top of at least one of the side walls, followed by further insertion of the connector along a second direction parallel to the substrate after the connector moves past the back stop.

Item 61 is the connector assembly of item 57, wherein the frame further comprises a spring at the front wall, such that when the connector is inserted into the frame and makes contact with the substrate, the spring pushes the connector against the back stop.

Descriptions for elements in figures should be understood to apply equally to corresponding elements in other figures, unless indicated otherwise. The present invention should not be considered limited to the particular embodiments described above, as such embodiments are described in detail in order to facilitate explanation of various aspects of the invention. Rather, the present invention should be understood to cover all aspects of the invention, including various modifications, equivalent processes, and alternative devices falling within the scope of the invention as defined by the appended claims and their equivalents.

What is claimed is:

1. A connector for providing solderless contact between a plurality of conductors and a corresponding plurality of contact pads disposed on a substrate, the connector comprising:

an elongated beam extending along a first direction;

a plurality of spaced apart resilient first fingers, each first finger extending from the beam and terminating at a finger tip; and a base comprising a plurality of channels extending along a second direction, each channel being configured to receive n conductors, n being an integer and at least one, the channel corresponding to n resilient first fingers facing a front end of the channel, the finger tips of the n resilient first fingers being lower than the front end of the channel, such that when the channel receives n conductors with a front portion of each conductor extending beyond the front end of the channel and bent so that a front end of the conductor is disposed under a corresponding finger tip, and the connector is positioned on a substrate with the corresponding finger tip disposed on a corresponding contact pad, the corresponding finger tip securely holds the front end of the conductor in contact with the contact pad.

2. The connector of claim 1, wherein the elongated beam, the plurality of spaced apart resilient first fingers, and the base form a unitary construction.

3. The connector of claim 1 being a unitary construction.

4. The connector of claim 1, wherein the first direction is perpendicular to the second direction.

5. The connector of claim 1, wherein the elongated beam has a top surface, a bottom surface, and a side surface connecting the top surface to the bottom surface, each first finger extending from the side surface of the elongated beam.

6. The connector of claim 1, wherein the finger tip of at least one first finger is electrically conductive and the finger tip of at least one other first finger is electrically insulative.

7. The connector of claim 1, wherein the plurality of channels comprises:

a plurality of first channels, each first channel being configured to receive m insulated conductors, m being an integer and at least two, the first channel corresponding to m resilient first fingers facing a front end of the first channel, the finger tips of the m resilient first fingers being lower than the first channel; and a plurality of second channels, each second channel being configured to receive p uninsulated conductors, p being an integer and at least one, the second channel corresponding to p resilient first fingers facing a front end of the second channel, the finger tips of the p resilient first fingers being lower than the second channel.

8. The connector of claim 1 further comprising an electrically conductive shield comprising a shield finger associated with a channel, the shield finger extending from a front end of the shield toward the finger tip of a first finger corresponding to the channel and terminating at a shield tip disposed under the finger tip, such that when the channel receives a conductor with a front portion of the conductor extending beyond the front end of the channel and bent so that a front end of the conductor is disposed under the finger tip, and the connector is positioned on a substrate with the finger tip disposed on a corresponding contact pad, the finger tip securely holds the front end of the conductor in contact with the corresponding contact pad and the shield tip.

9. A connector assembly comprising:

the connector of claim 1 for providing solderless contact between a plurality of conductors and a corresponding plurality of contact pads disposed on a substrate; and a frame for guiding a placement of the connector on the substrate, the frame comprising a front wall and opposing substantially parallel side walls extending from opposing ends of the front wall, the front wall and the side walls defining, at least partially, an open rear of the frame, such that when the frame is secured to the substrate with the contact pads located between the opposing side walls, the connector makes contact with the substrate by being inserted into the frame from the open rear of the frame, the side walls guiding the connector towards the front wall.

10. A connector for providing solderless contact between a plurality of conductors and a corresponding plurality of contact pads disposed on a substrate, the connector comprising:

a body;

a plurality of spaced apart fingers, each finger extending from the body and terminating at a resilient finger tip, such that when a front portion of each conductor in a plurality of conductors is disposed on a corresponding contact pad in a plurality of contact pads disposed on a substrate, the resilient finger tips securely hold the front portions in contact with the corresponding contact pads, wherein the finger tip of at least one finger is electrically conductive and the finger tip of at least one other finger is electrically insulative.

11. The connector of claim 10, wherein the body and the plurality of spaced apart fingers form a unitary construction.

12. A connector assembly comprising:

the connector of claim 10 for providing solderless contact between a plurality of conductors and a corresponding plurality of contact pads disposed on a substrate; and a frame for guiding a placement of the connector on the substrate, the frame comprising a front wall and opposing substantially parallel side walls extending from opposing ends of the front wall, the front wall and the side walls defining, at least partially, an open rear of the frame, such that when the frame is secured to the substrate with the contact pads located between the opposing side walls, the connector makes contact with the substrate by being inserted into the frame from the open rear of the frame, the side walls guiding the connector towards the front wall.

13. The connector assembly of claim 12, wherein the frame further comprises a top wall extending along, but not as far as, the side walls.

14. The connector assembly of claim 12, wherein the connector is initially inserted into the frame along a first direction making an oblique angle with the substrate in order to prevent the connector from running into a back stop protruding from a top of at least one of the side walls, followed by further insertion of the connector along a second direction parallel to the substrate after the connector moves past the back stop.

* * * * *